United States Patent [19]

Tanabe

[11] Patent Number: 5,068,688
[45] Date of Patent: Nov. 26, 1991

[54] DEVICE FOR AUTOMATICALLY LOADING AN IMAGE RECORDING APPARATUS WITH A RECORDING MEDIUM

[75] Inventor: Kazunori Tanabe, Nagoya, Japan

[73] Assignee: Brother Kogyo Kabushiki Kaishi, Nagoya, Japan

[21] Appl. No.: 318,346

[22] Filed: Mar. 3, 1989

[30] Foreign Application Priority Data

Mar. 3, 1988 [JP] Japan ............................. 63-28963[U]

[51] Int. Cl.$^5$ ...................... G03B 27/04; B65H 16/02
[52] U.S. Cl. .................................. 355/99; 242/67.1 R
[58] Field of Search .................. 226/91, 92; 242/57, 242/67.1 R, 195; 355/72, 91, 93, 99, 73, 100, 103, 104, 107, 108

[56] References Cited

U.S. PATENT DOCUMENTS

| | | | |
|---|---|---|---|
| 2,408,310 | 9/1946 | Hassler | 355/103 |
| 3,006,650 | 10/1961 | Ellmore | 242/195 |
| 3,318,219 | 5/1967 | Anderson | 355/91 X |
| 3,685,906 | 8/1972 | Raterman | 355/103 |
| 4,302,103 | 11/1981 | Zeunen | 355/91 X |
| 4,626,099 | 12/1986 | Zuelke et al. | 355/99 |
| 4,868,919 | 9/1989 | Tanaka et al. | 355/72 X |
| 4,912,510 | 3/1990 | Ogurd et al. | 355/72 X |
| 4,918,482 | 4/1990 | Ogurd | 355/72 X |
| 4,920,376 | 4/1990 | Yamamoto | 355/72 X |

Primary Examiner—Fred L. Braun
Attorney, Agent, or Firm—Oliff & Berridge

[57] ABSTRACT

A device for automatically loading an image recording apparatus with a web of a photosensitive recording medium includes a first belt for conveying a mask original into an exposure unit, and a mechanism facing the belt and movably supported on a frame so as to be movable toward and away from the first belt. The mechanism and the belt define therebetween a path along which the web travels. The mechanism includes at least a pair of spaced rollers, and a second belt entrained by the rollers. Cams are provided for moving the mechanism to bring the second belt into intimate contact with the first belt, so that the leading end of the web may be held between the two belts. The first belt is moved to enable the web to travel along its path. The web is further conveyed to a predetermined position where the leading end of the web is in sliding contact with the peripheral surface of a take-up roller. Since the take-up roller carries an adhesive layer on the periphery thereof, the web is wound around the take-up roller.

6 Claims, 2 Drawing Sheets

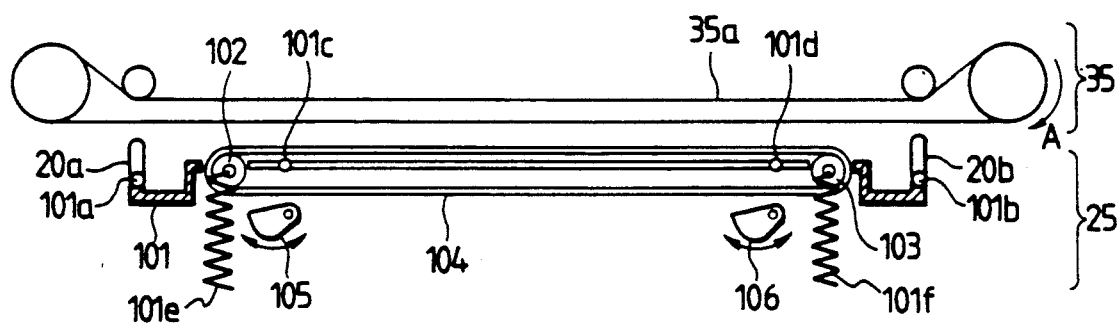
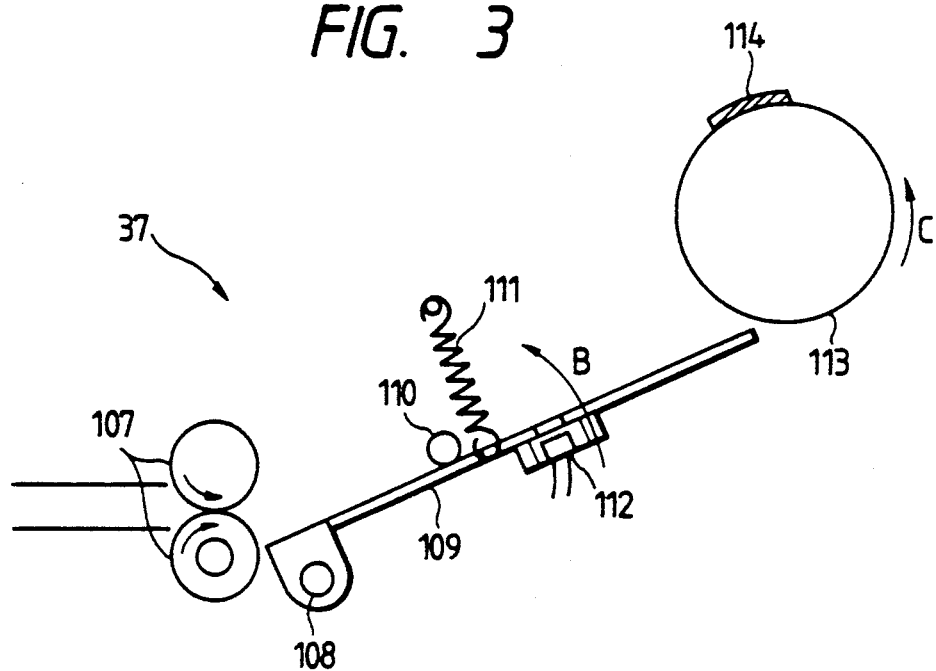

DEVICE FOR AUTOMATICALLY LOADING AN IMAGE RECORDING APPARATUS WITH A RECORDING MEDIUM

BACKGROUND OF THE INVENTION

This invention relates to an automatic sheet loading device, and more particularly to a device for automatically loading an image recording apparatus with an elongated photosensitive pressure-sensitive recording medium.

An elongated, web-like photosensitive pressure-sensitive recording medium is usually employed in an image recording apparatus. For loading the apparatus with a roll of such a recording medium, it has been necessary for the user of the apparatus to draw the leading end of the medium from its roll, pass it through an exposure, developing and other units of the apparatus in seriatim, and wind it around a take-up roller. This work has to be done whenever the recording medium is changed to a new one, and is not an easy job. As the image recording apparatus is usually constructed so that the path through which the recording medium travels is so narrow, a great deal of care and a considerably long time are required for passing the leading end of the recording medium therethrough and winding it around the take-up roller.

SUMMARY OF THE INVENTION

Under these circumstances, it is an object of this invention to provide a device which enables an automatic loading of a photosensitive pressure-sensitive recording medium in a recording apparatus.

It is another object of this invention to provide a device which enables the automatic winding of a web of a photosensitive pressure-sensitive recording medium about a take up roller in the image recording apparatus.

The above and other objects are attained by a device for automatically loading an image recording apparatus with a web of a photosensitive recording medium, the web having a leading end, the image recording apparatus recording an image of an original on the recording medium and having an exposure unit for exposing the recording medium to light through the original, the device comprising:

a frame;

a first belt for conveying the original into the exposure unit;

a mechanism facing the first belt and movably supported on the frame so as to be movable toward and away from the first belt, the mechanism and the first belt defining therebetween a path along which the web travels, the mechanism including at least a pair of spaced rollers, and a second belt entrained by the pair of rollers;

means for moving the mechanism to bring the second belt into intimate contact with the first belt, so that the leading end of the web is held between the first and the second belts; and means for moving the first belt in a predetermined direction to enable the web to travel through the path.

In an image recording apparatus in which a take-up roller is further included for taking up the web on a peripheral surface thereof, the device may further comprise:

a pair of conveyor rollers rotatably provided on the frame for holding the web therebetween and conveying the web toward the take-up roller;

a web guide member extending between one of the pair of conveyor rollers and the take-up roller for guiding the web to the take-up roller, the web guide member including a base having two ends, one end thereof being rotatably supported on the frame at a position adjacent to the one of the pair of conveyor rollers and the other end thereof being urged toward the peripheral surface, the guide member further including a detector provided in the base for detecting the leading end of the web, wherein conveyance of the web is stopped when a predetermined period of time has elapsed after the leading end has been detected by the detector; and wherein the take-up roller carries an adhesive layer on the peripheral surface and the leading edge of the web is adhered to the adhesive layer.

In accordance with the present invention, when the leading end of the recording medium is introduced into the path between the mechanism and the first belt, the mechanism is moved toward the first belt so that the second belt is brought to intimate contact with the first belt, whereby the leading end of the recording medium is caught between the two belts. The first belt is moved in the predetermined direction, whereby the recording medium is automatically loaded in its appropriate position in the exposure unit of the apparatus.

The device of this invention enables the leading end of the recording medium to move automatically through a narrow passage defined between the mechanism and the first belt and relieves the user of the apparatus from any trouble to pass the leading end of the recording medium manually through the passage. The device also ensures the accurate loading of the recording medium, as the first and the second belts between which the recording medium is held have a wide area of contact with each other.

In further accordance with the present invention, as the conveyor rollers are rotated, the recording medium is moved along the guide member and its leading end is detected by the detector. The rotation of the conveyor rollers is further continued until it is stopped temporarily when the recording medium has been moved by a certain additional distance along the guide member. When the conveyor rollers have stopped their rotation, the leading end of the recording medium is brought in sliding contact with the peripheral surface of the take-up roller. The leading end of the recording medium is caused to stick to the adhesive layer on the rotating take-up roller, whereby it is wound about the take-up roller.

The device of this invention relieves the user of the apparatus from any trouble to pass the recording medium therethrough and fasten its leading end to the take-up roller manually and thereby facilitates the loading of the recording medium in the apparatus.

BRIEF DESCRIPTION OF THE DRAWINGS

In the drawings:

FIG. 2 is a schematic cross-sectional elevation showing an exposure stand employed in the apparatus of FIG. 1; and FIG. 3 is a schematic cross-sectional elevation showing a take up unit in the apparatus of FIG. 1.

DETAILED DESCRIPTION OF THE INVENTION

Figure 1:
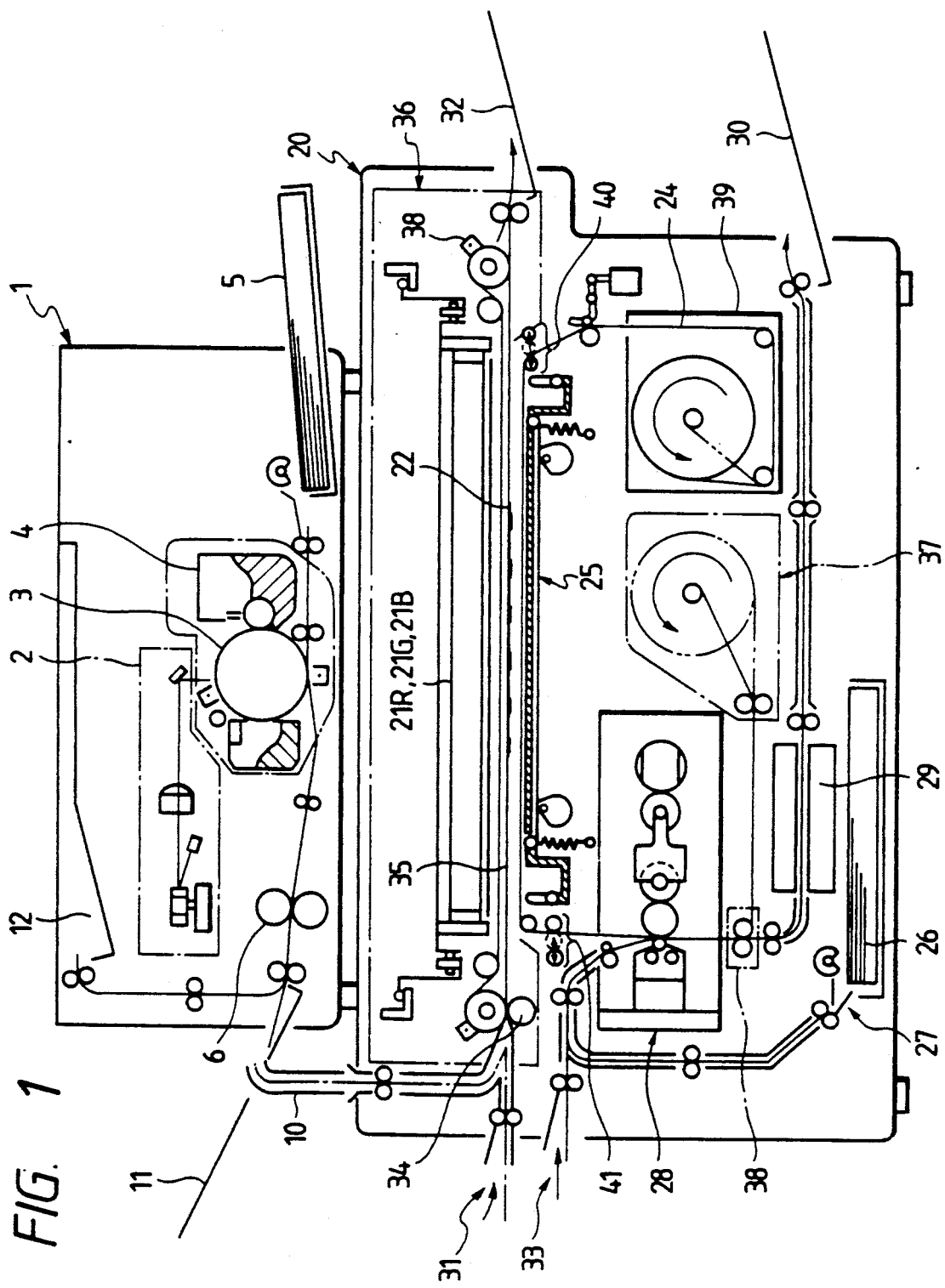
FIG. 1 is a schematic cross-sectional elevation showing a color image recording apparatus embodying this invention.

A color image recording apparatus combined with a monochromatic laser printer is shown by way of example in FIG. 1. The printer 1 includes a polygonal scanner unit 2 which applies laser light onto a photosensitive drum 3 which has been electrostatically precharged to a certain polarity. By the application of the laser light thereonto, an electrostatic latent image is formed thereon. The latent image is developed by a developing device 4 to form a toner image, and the latter is transferred onto a sheet of ordinary paper or a transparent sheet, e.g. an OHP sheet for use in an overhead projector, which is supplied from a paper cassette 5. Then, the image is fixed by a fixing device 6. The printer 1 is usually used for recording data transmitted from a host computer (not shown). If an ordinary monochromatic (black) image output is desired, the paper carrying such an image is discharged from the printer 1 onto a tray 11 or 12.

The color image recording apparatus embodying this invention is generally designated by reference numeral 20. The apparatus 20 employs mask originals for recording a color image. The term "mask original" as used herein is intended to mean a sheet of paper on which is formed a light shielding image corresponding to one of three primary color components of the original color image. The mask originals are produced by the printer 1 in accordance with information regarding the color image of the original, and are supplied to the apparatus 20. The apparatus 20 includes a unit 10 for changing-over the path of the paper fed from the printer which delivers mask originals 22R, 22G and 22B to the apparatus 20. An exposure unit 3G is provided adjacent to the device 10 and includes three light sources 21R, 21G and 21B emitting respectively three primary color light rays of red, green and blue. The exposure unit 36 further includes en endless conveyor belt 35 for conveying the mask originals. A web cartridge 39 is positioned below the exposure unit 36 and contains a roll of a web of a photosensitive pressure-sensitive recording medium 24 having a surface coated with a layer of microcapsules containing dye precursors, etc. The recording medium 24 is unwound from its roll and supplied into the exposure unit 36. An exposure stand 25 is provided between the conveyor belt 35 and the cartridge 39 for causing the recording medium 24 to lie in a plane and to intimately contact the mask original 22. A pressure developing unit 28 is provided below the exposure stand 25 for bringing the recording medium 24 arriving from the exposure unit 36 and a developer sheet 26 into facial contact with each other and applying pressure to rupture the uncured microcapsules and thereby develop an image on the developer sheet 26. The developer sheet 26 is a sheet of paper coated on one surface thereof with a developer material. The developer material reacts with the dye precursor released from the ruptured microcapsules. The developer sheets 26 are stacked in a cassette 27, and the uppermost sheet is taken out therefrom and fed to the developing device 28. A thermal fixing device 29 is provided downstream of the developing device 28 for promoting the coloring of the developed color image. The recording medium 24 leaving the developing unit 28 is collected by a take up unit 37. A device 38 is provided between the developing unit 28 and the fixing device 29 for guiding the leading end of the recording medium 24 to the take-up unit 37 when it is loaded in the apparatus 20. When the apparatus 20 is in a recording mode, the device 38 serves to separate the developer sheet 26 from the recording medium 24 and conveys only the developer sheet 26 to the fixing device 29. A tray 31 is provided at one side of the exposure unit 36 for enabling the manual supply of the mask original 22 into the exposure unit 36. A tray 32 is provided at the other side of the exposure unit 36 for receiving the mask original 22 which is discharged therefrom. A tray 33 is further provided downwardly of the tray 31 for enabling the manual supply of a developer sheet into the developing unit 28.

Attention is now directed to FIG. 2 showing the exposure stand 25 in detail. The exposure stand 25 is disposed to cover substantially the whole bottom of the exposure unit 36. The exposure stand 25 includes a supporting member 101 extending in horizontal direction. A pair of vertically extending slots 20a and 20b are formed on one wall of a frame parallel to the sheet of drawing, and the supporting member 101 is provided at the opposite ends thereof with a pair of pins 101a and 101b extending through the slots 20a and 20b, respectively, so that the supporting member 101 is vertically movably suspended from the frame. A pair of rollers 102 and 103 are rotatably provided on the supporting member 101 in the positions adjacent to the opposite ends thereof. An endless conveyor belt 104 made of rubber or like material having a high coefficient of friction extends about and between the rollers 102 and 103. A pair of springs 101e and 101f are connected at one end to the rollers 102 and 103, respectively, and at other end to the frame of the apparatus for urging the supporting member 101 downwardly. A pair of eccentric cams 105 and 106 are rotatably supported on the frame near the rollers 102 and 103, respectively. A pair of pins 101c and 101d project laterally from the supporting member 101 and the cams 105 and 106 are engageable with the pins 101c and 101d, respectively, to vertically move the supporting member 101. If the cams 105 and 106 are cooperatingly rotated to engage the pins 101c and 101d to thereby raise the supporting member 101, the belt 104 is brought into intimate contact with a transparent mask original supporting belt 35a. The transparent belt 35a is an endless belt which is rotatable in two opposite directions.

Referring to FIG. 3, the take-up unit 37 includes a pair of rollers 107 disposed one above the other and adapted to hold the recording medium 24 therebetween and convey it by a frictional force, a take-up roller 113, and a web guide member 109 provided between the conveyor rollers 107 and the take-up roller 113. The rollers 107 are capable of stopping their rotations temporarily. The web guide member 109 has a base end rotatably supported by a shaft 108 attached to the frame near the bottom of the lower roller 107, and a free end which is remote from its base end, and which is urged toward the peripheral surface of the take-up roller 113 near its bottom by a spring 111 pulling the guide member 109 in the direction of an arrow B. A pin is provided for restricting the movement of the guide member 109 by the spring 111, so that its free end may not contact the take-up roller 113. A reflection type light sensor 112 is provided on the guide member 109 in alignment with an opening formed in its middle portion and is adapted to detect the leading end of the recording medium 24 which has been conveyed along the guide member 109. An adhesive tape 114 is attached to a part of the peripheral surface of the take-up roller 113.

Referring to the operation of the apparatus as arranged above, the web cartridge 39 is placed in the apparatus 20 after the leading end of the recording medium 24 or the leading end of a leading tape connected to the leading portion of the recording medium has been withdrawn from the cartridge 39, and the apparatus 20 is started for operation in the loading mode. One of a pair of rollers 40 otherwise staying away from each other is moved toward the other, so that they may hold the leading end of the recording medium 24 therebetween, and the rollers 40 are driven to feed it into the space between the exposure stand 25 and the mask original conveyor 35. The cams 105 and 106 are rotated to raise the supporting member 101, i.e. the exposure stand 25 and bring the belt 104 into intimate contact with the transparent belt 35a of the conveyor 35, whereby the recording medium 24 is held between the two belts 35a and 104. The conveyor 35 is rotated in the direction of an arrow A (see FIG. 2) which is opposite to the direction in which it is rotated to convey the mask original 22, whereby the recording medium 24 is passed through the exposure unit 36. One of a pair of rollers 41 which normally stay away from each other is moved toward the other, so that they may hold the leading end of the recording medium 24 therebetween. As the rollers 41 are driven, the recording medium 24 is conveyed between a pair of pressure rollers in the developing unit 28 which stay away from each other except during development, and through the device 38 by which the recording medium 24 is separated from the developer sheet. The recording medium 24 is conveyed until it reaches the take-up unit 37.

In the take-up unit 37, the recording medium 24 is held between the rollers 107 and is moved along the guide member 109 toward the take-up roller 113 as the rollers 107 ere rotated. As the recording medium 24 is moved along the guide member 109, its leading end is detected by the sensor 112. Upon detection of the leading end, the recording medium 24 is further moved forwardly by a predetermined distance until its leading end contacts the peripheral surface of the take-up roller 113 near its bottom, whereupon the rotation of the rollers 107 is stopped temporarily. The guide member 109 is in the position in contact with the pin 110 by the action of the spring 111 at such an angle that the leading end of the recording medium 24 may properly contact the peripheral surface of the take-up roller 113. If the take-up roller 113 is rotated in the direction of an arrow C, the leading end of the recording medium 24 sticks to the adhesive tape 114 on the take up roller 113 and the recording medium 24 is wound on the take-up roller 113.

When the recording medium 24 has been loaded as hereinabove described, each pair of rollers 40 and 41 are spaced apart from each other so as not to damage the microcapsules on the surface of the recording medium 24. As the recording medium 24 is wound about the take-up roller 113, the free end of the guide member 109 bears on the outer surface of the recording medium 24 wound about the take-up roller 113 and the guide member 109 is gradually downwardly moved while overcoming the force of the spring 111 so as not to hinder the winding of the recording medium 24.

Although the apparatus has been described as including both of the exposure stand and the take-up unit, it is possible to facilitate greatly the loading of a photosensitive pressure-sensitive recording medium in a color image recording apparatus, even if only one of these two may be employed.

While the invention has been described with reference to a preferred embodiment thereof, it is to be understood that various changes and modifications may be made by a person skilled in the art without departing from the scope and spirit of the invention which is defined by the appended claims.

What is claimed is:

1. A device for automatically loading an image recording apparatus with a web of a photosensitive recording medium, said web having a leading end, the image recording apparatus including a take-up roller for taking up the web on a peripheral surface thereof, said device comprising:

a frame;

a pair of conveyor rollers rotatably provided on said frame for holding said web therebetween and conveying said web toward said take-up roller;

a web guide member extending between one of said pair of conveyor rollers and said take-up roller for guiding said web to said take-up roller, said web guide member including a base having two ends, one end thereof being rotatably supported on said frame at a position adjacent to said one of said pair of conveyor rollers and the other end thereof being urged toward said peripheral surface, said guide member further including a detector provided in said base for detecting said leading end of said web, wherein conveyance of said web is stopped when a predetermined period of time has elapsed after said leading end has been detected by said detector; and wherein said take-up roller carries an adhesive layer on said peripheral surface and said leading edge of said web is adhered to said adhesive layer.

2. A device as set forth in claim 1, wherein said web guide member further includes a pin for restricting the movement of said web guide member urged toward said peripheral surface.

3. A device for automatically loading an image recording apparatus with a web of a photosensitive pressure-sensitive recording medium, said web having a leading end, said image recording apparatus recording an image of an original on the recording medium and having an exposure unit for exposing the recording medium to light through the original, said device comprising:

a frame;

a first belt for conveying said original into said exposure unit;

a mechanism facing said first belt and movably supported on said frame so as to be movable toward and away from said first belt, said mechanism and said first belt defining therebetween a path along which said web travels, said mechanism including at least a pair of spaced rollers, and a second belt entrained by said pair of rollers;

means for moving said mechanism to bring said second belt into intimate contact with said first belt, so that said leading end of said web is held between said first and said second belts;

means for moving said first belt in a predetermined direction to enable said web to travel through said path;

a take-up roller for taking up said web on a peripheral surface thereof;

a pair of conveyor rollers rotatably provided on said frame for holding said web therebetween and conveying said web toward said take-up roller; and a web guide member extending between one of said pair of conveyor rollers and said take-up roller for guiding said web to said take-up roller, said web guide member including a base having two ends, one end thereof being rotatably supported on said frame at a position adjacent to said one of said pair of conveyor rollers and the other end thereof being urged toward said peripheral surface, said guide member further including a detector provided in said base for detecting said leading end of said web, wherein conveyance of said web is stopped when a predetermined period of time has elapsed after said leading end has been detected by said detector;

wherein said take-up roller carries an adhesive layer on said peripheral surface and said leading edge of said web is adhered to said adhesive layer.

4. A device as set forth in claim 3, wherein said mechanism further includes a supporting member movably supported on said frame, said mechanism being supported on said supporting member.

5. A device as set forth in claim 4, wherein said mechanism moving means comprises a pair of cams rotatably supported on said frame, said pair of cams being engageable with said supporting member to move the latter toward said first belt.

6. A device as set forth in claim 5, wherein said mechanism moving means further comprises a pair of springs, each connecting one of said pair of rollers to said frame for urging said second belt in a direction away from said first belt.

* * * * *